(12) United States Patent
Ikeda

(10) Patent No.: US 7,872,261 B2
(45) Date of Patent: Jan. 18, 2011

(54) TRANSPARENT THIN FILM TRANSISTOR AND IMAGE DISPLAY UNIT

(75) Inventor: Noriaki Ikeda, Tokyo (JP)

(73) Assignee: Toppan Printing Co., Ltd. (JP)

( * ) Notice: Subject to any disclaimer, the term of this patent is extended or adjusted under 35 U.S.C. 154(b) by 17 days.

(21) Appl. No.: 12/390,224

(22) Filed: Feb. 20, 2009

(65) Prior Publication Data
US 2009/0212291 A1    Aug. 27, 2009

(30) Foreign Application Priority Data

Feb. 22, 2008  (JP) ............................ 2008-040797
Sep. 22, 2008  (JP) ............................ 2008-243379

(51) Int. Cl.
H01L 29/04    (2006.01)
H01L 29/10    (2006.01)
H01L 31/00    (2006.01)

(52) U.S. Cl. .................. 257/59; 438/22; 438/149; 257/72; 257/E51.005; 257/E51.006

(58) Field of Classification Search ................. 438/149, 438/609, 22; 257/72, 59, 347, 258, E33.064, 257/E31.126, E51.005, E51.006
See application file for complete search history.

(56) References Cited

U.S. PATENT DOCUMENTS 5,270,845 A * 12/1993 Sakamoto et al. ........... 349/147
5,771,083 A *  6/1998 Fujihara et al. ............. 349/147
5,877,832 A *  3/1999 Shimada ..................... 349/138
2007/0252928 A1* 11/2007 Ito et al. ..................... 349/106

FOREIGN PATENT DOCUMENTS

JP    2000-150900    5/2000
JP    2006-165528    6/2006

OTHER PUBLICATIONS

Nomura, et al., "Room-temperature fabrication of transparent flexible thin-film transistors using -morphous oxide semiconductors", *Nature*, Nov. 25, 2004, pp. 488-492.

* cited by examiner

Primary Examiner—Julio J Maldonado
Assistant Examiner—Shaka Scarlett
(74) Attorney, Agent, or Firm—Squire, Sanders & Dempsey L.L.P.

(57) ABSTRACT

An embodiment of the present invention is an transparent thin film transistor which has an substantially transparent substrate, a gate line made of a thin film of a substantially transparent conductive material, a substantially transparent gate insulating film, a substantially transparent semiconductor active layer, a source line made of a thin film of a metal material and a drain electrode made of a thin film of a substantially transparent conductive material. In addition, the source line and the drain electrode are formed apart from each other and sandwich the substantially transparent semiconductor active layer. Moreover, at least any one of the thin film of the gate line and the thin film of the source line is stacked with a thin film of a metal material.

16 Claims, 5 Drawing Sheets

[A]

[B]

TRANSPARENT THIN FILM TRANSISTOR AND IMAGE DISPLAY UNIT

CROSS REFERENCE

This application claims priority to Japanese application number 2008-040797, filed on Feb. 22, 2008, and priority to Japanese application number 2008-243379, filed on Sep. 22, 2008, which are incorporated herein by reference.

BACKGROUND OF THE INVENTION

1. Field of the Invention

The present invention relates to a transparent thin film transistor and an image display unit. In particular the present invention relates to a transparent thin film transistor and an image display unit which can uniformly and steadily operate in which a wiring resistance is reduced.

2. Description of the Related Art

In recent years, the thin film transistor which used amorphous silicon, poly silicon, metal oxide semiconductors, organic semiconductors or the like as a driving transistor of electronic devices has been used. However, since amorphous silicon, poly silicon and organic semiconductors are optically sensitive in the region of visible light, light shielding layers are necessary.

On the other hand, transparent metal oxide semiconductors which have large band gaps are not optically sensitive in the region of visible light and can be deposited at low temperature. Therefore, a transparent thin film transistor which is flexible can be fabricated on a substrate such as a plastic substrate or a film (referred to as patent literature 1). The thin film transistor which used the metal oxide semiconductors attracts a lot of attention as the realization of the improvement in the aperture ratio of the active matrix display units or the realization of the new display structures.

In a general active matrix display unit, it is not necessary for a wiring to be transparent. Therefore, stacked films or alloy of metal materials such as aluminum (Al), copper (Cu), molybdenum (Mo) or tungsten (W) are mainly used for a general opaque thin film transistor. However, it is necessary not only for a semiconductor active layer but also for its wiring to be transparent to form a transparent thin film transistor. Now, indium tin oxide (ITO), indium zinc oxide, (IZO) or the like which is well-known as transparent conductive materials are used as a main material for the wiring.

However, when a wiring of an active matrix display unit is made of a transparent conductive material, an electrical resistivity thereof is high, compared with an electrical resistivity of metal materials. Therefore, it is difficult to drive a thin film transistor uniformly because of an effect of a wiring resistance when a panel size becomes large.

The present invention is to provide a transparent thin film transistor and an image display unit which can uniformly and steadily operate where a wiring resistance is reduced.

Patent Document 1: Japanese Patent Laid-Open No. 2000-150900 Official Gazette

Patent Document 2: Japanese Patent Laid-Open No. 2006-165528 Official Gazette

Non-Patent Document 1: K. Nomura et. Al., Nature, Vol. 432(2004-11), p. 488-492

SUMMARY OF THE INVENTION

An embodiment of the present invention is an transparent thin film transistor which has an substantially transparent substrate, a gate line made of a thin film of a substantially transparent conductive material, a substantially transparent gate insulating film, a substantially transparent semiconductor active layer, a source line made of a thin film of a substantially transparent conductive material and a drain electrode made of a thin film of a substantially transparent conductive material. In addition, the source line and the drain electrode are formed apart from each other and sandwich the substantially transparent semiconductor active layer. Moreover, at least any one of the thin film of the gate line and the thin film of the source line is stacked with a thin film of a metal material.

BRIEF DESCRIPTION OF THE DRAWINGS

FIG. 1 (A) is a vertical cross-sectional view taken along the line a-a' in FIG. 3 (A). FIG. 1 (B) is a vertical cross-sectional view taken along the line b-b' in FIG. 3 (B).

FIG. 2(A) is a vertical cross-sectional view taken along the line b-b' in FIG. 3(A).

FIG. 4 is a vertical cross-sectional view taken along the line c-c' in FIG. 5.

1 is a substantially transparent substrate, 2 is a gate line (a gate wiring), 3 is a capacitor line (a capacitor wiring), 4 is a substantially transparent gate insulating film, 5 is a substantially transparent semiconductor active layer, 6 is a source line (a source wiring), 7 is a drain electrode, 8 is an interlayer insulating film, 9 is a pixel electrode, 10 is a color filter, 11 is a gate auxiliary line (a gate auxiliary wiring), 12 is a capacitor auxiliary line (a capacitor auxiliary wiring), 13 is a source auxiliary line (a source auxiliary wiring), 14 is a display element, 15 is a common electrode, 20 is a transparent thin film transistor.

DETAILED DESCRIPTION OF THE INVENTION

The embodiments of the present invention are explained below referring the diagrams. In addition, the constituent elements have its own identical signs in the embodiments and duplicative explanation between the embodiments is omitted.

Figure 1:
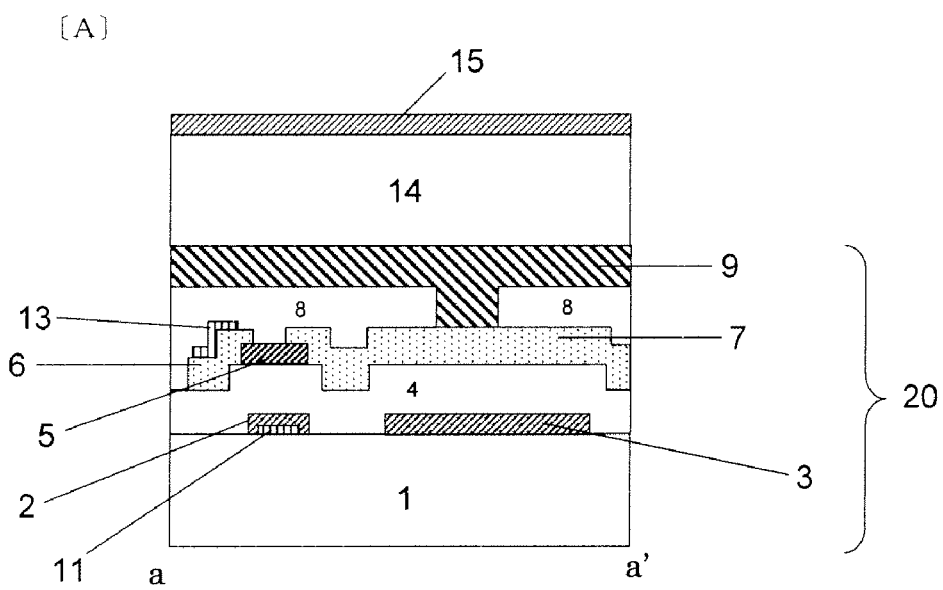
FIGS. 1 (A) and (B) are partial cross-sectional diagrams which show approximately one pixel of an image display unit using a transparent thin film transistor in an embodiment of the present invention. In addition, in FIGS. 1 (A) and (B), ratios between a film thicknesses of respective layers of a transparent thin film transistor do not show ratios between a film thicknesses of a transparent thin film transistor of an actual image display unit.
Figure 1:
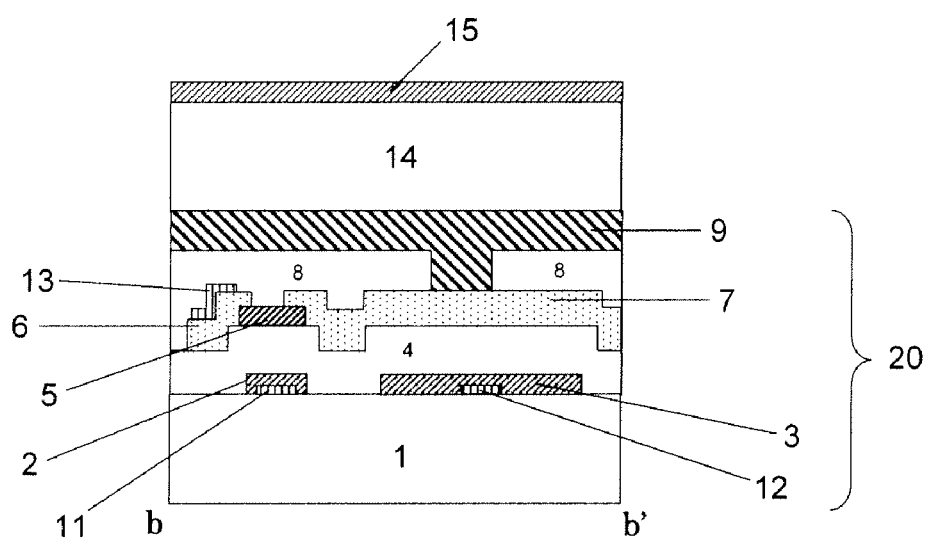

As FIGS. 1(A) and (B) show, a transparent thin film transistor which is used for an image display unit in the embodiment of the present invention has a substantially transparent substrate 1, a gate line 2, a gate insulating film 4, a substantially transparent semiconductor active layer 5, a source line 6 and a drain electrode 7. Moreover, when the transparent thin film transistor is used for an image display unit, the transparent thin film transistor includes a capacitor line 3, an interlayer insulating film 8 and a pixel electrode 9.

"Substantially transparent" means transmittance of 70% or more in the wavelength range of equal to or more than 400 nm and equal to or less than 700 nm corresponding to visible light.

For the substantially transparent substrate 1 in the embodiment of the present invention, in particular, polymethyl methacrylate, polyacrylates, polycarbonate, polystyrene, polyethylen sulfide, polyethersulfone, polyolefin, polyethylene terephthalate, polyethylenenaphthalate, cyclo-olefin polymers, polyether sulfone, triacetylcellulose, polyvinyl fluoride film, ethylene-tetrafluoroethylene copolymer resin, weatherable polyethylene terephthalate, weatherable polypropylene, glass fiber-reinforced acryl resin film, glass fiber-reinforced polycarbonate, transparent polyimide, fluorinated resin, cyclic polyolefin resin, glass, quartz or the like can be used, but usable materials are not limited to these in the present invention. A substantially transparent substrate 1 having only one material among above mentioned materials can be used, but a composite substantially transparent substrate stacking two or more materials among above mentioned materials can also be used.

In addition, when the substantially transparent substrate 1 in the embodiment of the present invention is an organic film, a transparent gas barrier layer (not illustrated) may be formed in order to improve the durability of an element of the transparent thin film transistor 20. Aluminium oxide ($Al_2O_3$), silicon oxide ($SiO_2$), silicon nitride (SiN), silicon oxynitride (SiON), silicon carbide (SiC), diamond-like carbon (DLC) or the like can be used for the gas barrier layer, but usable materials are not limited to these materials in the present invention. In addition, a gas barrier layer may also be used by stacking two or more layers. The gas barrier layer may be formed on only one side or both sides of the substantially transparent substrate 1 which uses an organic film. The gas barrier layer can be formed by a vacuum evaporation method, an ion plating method, a sputtering method, a laser ablation method, a plasma CVD (Chemical Vapor Deposition) method, a hot wire CVD method or a sol-gel method, but usable methods are not limited to these methods in the present invention.

The gate line 2, the source line 6 and the capacitor line 3 which are used for the transparent thin film transistor in the embodiment of the present invention may be formed by stacking two or more of a thin film of a substantially transparent conductive material and of a thin film of a metal material (hereinafter referred to as "an auxiliary line" (an auxiliary wiring)). By adding an auxiliary line to the gate line 2, the source line 6 and the capacitor line 3, a wiring resistance thereof can be significantly reduced and an image display unit can steadily and uniformly operate. In particular, an auxiliary line which is made of a metal thin film can be preferably used for the gate line 2 and the source line 6.

For a substantially transparent conductive material, an oxide material such as indium oxide ($In_2O_3$), tin oxide ($SnO_2$), zinc oxide (ZnO), cadmium oxide (CdO), cadmium indium oxide ($CdIn_2O_4$), cadmium tin oxide ($Cd_2SnO_4$) or zinc tin oxide ($Zn_2SnO_4$) can be used, but usable materials are not limited to these materials in the present invention. In addition, the oxide materials doped with impurity are also preferably used. For example, indium oxide doped with tin (Sn), molybdenum (Mo), titanium (Ti), tungsten (W), gallium (Ga), cerium (Ce) or zinc (Zn) and zinc oxide doped with aluminum (Al) and gallium (Ga) can be used. Among these doped materials, indium tin oxide (common name ITO) in which indium oxide is doped with tin (Sn) and indium zinc oxide (common name IZO) in which indium oxide is doped with zinc (Zn) are preferably used in particular in terms of their high transparencies and low electrical resistivities.

For an auxiliary line, gold (Au), silver (Ag), copper (Cu), cobalt (Co), tantalum (Ta), molybdenum (Mo), chromium (Cr), aluminum (Al), nickel (Ni), tungsten (W), platinum (Pt) and titanium (Ti) can be used, but usable materials are not limited to these materials in the present invention. In addition, alloy of the above mentioned metal, metal doped with impurity or layers formed by stacking a plurality of thin films of the above mentioned metals can also be used.

A film thickness of an auxiliary line preferably is equal to or more than 5 nm and equal to or less than 150 nm, but more preferably is equal to or less than 50 nm. When the film thickness of an auxiliary line is less than 5 nm, a thin film of a metal material forms an island shape. Therefore, a uniform thin film cannot be formed and there is fear that an effect of an auxiliary line cannot be expected. In addition, when the film thickness of an auxiliary line is more than 150 nm, because difference in level occurs on the gate insulating film by asperity caused by an auxiliary line, there is a possibility that a leak occurs between the gate line and the source line.

A line width of an auxiliary line is preferably patterned as narrow as possible in order not to decrease an aperture ratio of an image display unit. By making a line width of an auxiliary line narrow, even if an auxiliary line which is made of a metal material is used, reduction in transmittance of a transparent thin film transistor can be controlled and an aperture ratio of an image display unit can be kept high. A line width of an auxiliary line is preferably formed so that an area ratio of an auxiliary line to a pixel area is equal to or less than 5%, because influence to visibility is small.

As FIGS. 3(A) and (B) show, the transparent thin film transistor in the embodiment of the present invention has a gate line 2, a capacitor line 3, a substantially transparent semiconductor active layer 5, a source line 6, a drain electrode 7, a gate auxiliary line 11 and a source auxiliary line 13. Moreover, a capacitor auxiliary line 12 may be arranged on the transparent thin film transistor.

In addition, depending on a shape of an image display unit, a structure that only a gate line 2 has an auxiliary line or only a source line 6 has an auxiliary line can also be applicable.

The present inventor used aluminum (Al) as a material of an auxiliary line and changed a line width of an auxiliary line. Then, a relation between visibility and a wiring resistance was studied. The result of the study is shown in Table 1.

TABLE 1

| An area ratio of an auxiliary line to a display area | visibility | wiring resistance |
|---|---|---|
| 0% | ○ | x |
| 0.5% | ○ | x |
| 1% | ○ | Δ |
| 5% | ○ | ○ |
| 10% | Δ | ○ |
| 15% | x | ○ |

A relation between visibility and a wiring resistance in the case where a film thickness of an auxiliary line made of aluminum (Al) is 30 nm and an area ratio of an auxiliary line to a pixel electrode 9 is 0-15% is shown in Table 1. When an area ratio of an auxiliary line to an image display area of an image display unit is equal to or more than 10%, because visible transmittance of a transparent thin film transistor and an aperture ratio of an image display unit are reduced, an influence on visibility becomes large.

When line widths of a gate auxiliary line 11, a capacitor auxiliary line 12 and a source auxiliary line 13 are patterned to be narrower than those of wirings which are made of a substantially transparent conductive material, reduction of an aperture ratio of the transparent thin film transistor can be prevented by forming respective line widths of the above auxiliary lines to be equal to or more than 1 µm and the area ratios of respective wirings to an image display area in an image display unit to be equal to or less than 10%. In addition, in the case where the transparent thin film transistor is used as an image display unit, degradation of display quality can be prevented.

In addition, in order to prevent oxidization and time degradation of an auxiliary line in the layer stack including a substantially transparent conductive material thin film and the auxiliary line, it is preferable to form a conductive oxide thin film on an auxiliary line, if possible. However, a film formed on an auxiliary line is not limited to a conductive oxide thin film in the present invention.

A drain electrode 7 and a pixel electrode 9 in the embodiment of the present invention can be formed by the same constitution and the same material as a gate line 2, a capacitor line 3 and a source line 6. However, because impact of a resistivity in the drain electrode 7 and the pixel electrode 9 is smaller than that in the gate line 2, the capacitor line 3 and the source line 6, a drain electrode 7 and a pixel electrode 9 should be formed only by a transparent conductive oxide material in terms of visibility.

Contact resistance between a source line 6 and a substantially transparent semiconductor active layer 5 can be reduced, when a part where the source line 6 and the substantially transparent semiconductor active layer 5 meet has a thin film of a substantially transparent conductive material. However, a usable material is not limited to the above mentioned material.

A thin film of a substantially transparent conductive material and an auxiliary line can be formed by a vacuum evaporation method, an ion plating method, a sputtering method, a laser ablation method, a plasma CVD method, a photo-CVD method, a hot wire CVD method or the like, but usable methods are not limited to these methods in the present invention.

As a substantially transparent semiconductor active layer 5 which is used for the transparent thin film transistor 20 in the embodiment of the present invention, an oxide semiconductor which is composed mostly of metal oxide can be used. An oxide semiconductor is an oxide which includes one or more elements selected from zinc (Zn), indium (In), tin (Sn), tungsten (W), magnesium (Mg) and gallium (Ga). The material such as zinc oxide (ZnO), indium oxide ($In_2O_3$), indium zinc oxide (In—Zn—O), tin oxide ($SnO_2$), tungsten oxide (WO) and indium gallium zinc oxide (In—Ga—Zn—O) can be used, but usable materials are not limited to these materials in the present invention. These materials are substantially transparent. In addition, it is preferable that a band gab is equal to or more than 2.8 eV and more preferably is equal to or more than 3.2 eV. Structure of these materials may be single-crystal, polycrystal, crystallite, mixed crystal of crystal/amorphous, nanocrystal scatterring amorphous or amorphous. It is preferable that a film thickness of the substantially transparent semiconductor active layer 5 is equal to or more than 20 nm.

An oxide semiconductor which is used for the substantially transparent semiconductor active layer 5 is not optically sensitive in the region of visible light. Therefore, the transparent thin film transistor 20 can be fabricated and the improvement in the aperture ratio of the active matrix display unit can be achieved and a new display structure can be obtained.

As a process for depositing the substantially transparent semiconductor active layer 5, a method such as a sputtering method, a pulsed laser deposition method, a vacuum evaporation method, a CVD method, MBE (Molecular Beam Epitaxy) method, ALD (Atomic Layer Deposition) method and a sol-gel method can be preferably used. However, more preferably, a sputtering method, a pulsed laser deposition, a vacuum evaporation method and CVD method are used. As a sputtering method, a RF magnetron sputtering method and a DC sputter method can be used, as a vacuum evaporation method, a resistance heating evaporation method, an electron beam evaporation method and an ion plating method can be used, and as a CVD method, a hot wire CVD method and a plasma CVD method can be used, but usable methods are not limited to these methods in the present invention.

For a material which is used for a gate insulating film 4 of the transparent thin film transistor 20 in the embodiment of the present invention, as an inorganic material, silicon oxide, silicon nitride, silicon oxynitride, aluminium oxide, tantalum oxide ($Ta_2O_5$), yttrium oxide ($Y_2O_3$), hafnium oxide ($HfO_2$), hafnium aluminates (HfAlO), zirconium dioxide ($ZrO_2$), titanic oxide ($TiO_2$) or the like, or as an organic material, polyacrylates such as polymethyl methacrylate (PMMA), polyvinyl alcohol (PVA), polystyrene (PS), transparent polyimide, polyester, epoxy, poly vinylphenol or the like can be used. However, the usable materials are not limited particularly in the present invention. In order to control a gate leak current, an electrical resistivity of the insulating materials should be equal to or more than $10^{11}$ Ω·cm, and more preferably it should be equal to or more than $10^{14}$ Ω·cm. A gate insulating film 4 can be formed by a method such as a vacuum evaporation method, an ion plating method, a sputtering method, a laser ablation method, a plasma CVD method, a photo-CVD method, a hot wire CVD method, a spin coat method, a dip coat method or a screen printing method. However, the methods are not limited to these methods in the present invention. It is preferable that a film thickness of the gate insulating film 4 is 50 nm~2 µm. The gate insulating film 4 may be used as a monolayer or as a layer which is stacked by plural layers. In addition, the gate insulating film 4 may be used as a layer which has a composition sloping toward growth direction of the film.

As a structure of the transparent thin film transistor 20 in the embodiment of the present invention, either a bottom contact type or a top contact type may be used. However, a structure type is not limited particularly.

The interlayer insulating film 8 in the embodiment of the present invention is not limited as long as it has insulation properties and is substantially transparent. For example, as an inorganic material, silicon oxide, silicon nitride, silicon oxynitride, aluminium oxide, tantalum oxide, yttrium oxide, hafnium oxide, hafnium aluminates, zirconium dioxide, titanic oxide or the like, or as an organic material, polyacrylates such as polymethyl methacrylate (PMMA), polyvinyl alcohol (PVA), polystyrene (PS), transparent polyimide, polyester, epoxy, poly vinylphenol or the like can be used. However, the usable materials are not limited to these materials in the present invention. The interlayer insulating film 8 may be formed by the same material as the gate insulating film 4 or a material different from the gate insulating film 4. The interlayer insulating film 8 may be used as a monolayer or as a layer which is stacked by plural layers.

When a structure of the transparent thin film transistor 20 in the embodiment of the present invention is a bottom gate type, a protective film (not illustrated) which covers the substantially transparent semiconductor active layer 5 may be formed. By forming the protective film, the substantially transparent semiconductor active layer 5 is not deteriorated with age by humidity or the like and is not influenced from the interlayer insulating film 8. For the protective film, as an inorganic material, silicon oxide, silicon nitride, silicon oxynitride, aluminium oxide, tantalum oxide, yttrium oxide, hafnium oxide, hafnium aluminates, zirconium dioxide, titanic oxide or the like, or as an organic material, polyacrylates such as polymethyl methacrylate (PMMA), polyvinyl alcohol (PVA), polystyrene (PS), transparent polyimide, polyester, epoxy, poly vinylphenol, fluorinated resin or the like can be used. However, the usable materials are not limited to these materials in the present invention. The protective film may be used as a monolayer or as a layer which is stacked by plural layers.

The pixel electrode 9 has to be electrically connected with the drain electrode 7 of the transparent thin film transistor 20. In particular, the process in which the interlayer insulating film 8 is not formed on a part of the drain electrode 9 by forming pattern-printed interlayer insulating film 8 by a method such as a screen method and the process in which after having applied the interlayer insulating film 8 to the drain electrode 7, a hole is formed in the interlayer insulating film 8 by laser beam can be used. However, the process is not limited to these processes in the present invention.

As shown in FIGS. 2(A) and (B), an image display unit in the embodiment of the present invention has a color filter 10 between a substantially transparent substrate and a layer in which a gate line 2 is formed.

The color filter 10 in the embodiment of the present invention preferably has three colors, that is, a red filter (R), a green filter (G) and a blue color filter (B). Or, it preferably has a red filter (R), a green filter (G) and a blue color filter (B) and a white (transparent) filter (W), or, a cyan filter (C), a magenta filter (M) and a yellow filter (Y). However, a structure is not limited to these structures in the present invention. Each colored filter of the colored layers in the color filter 10 is patterned to be a suitable pattern form such as a form of line (stripe) matrix of a predetermined width or a form of rectangle matrix of a predetermined size. In addition, after forming a coloring pattern, a substantially transparent overcoat layer is preferably formed on the color filter 10 in order to protect a coloring pattern and to lower unevenness of the color filter 10.

By forming the color filter 10 between the substantially transparent substrate 1 and a layer in which the gate line 2 is formed, position alignment between the color filter 10 and a semiconductor circuit can be easily performed. In addition, it is possible to prevent a reduction of yield caused by defects which occurs at the time of position alignment when an image display unit which uses the color filter 10 is manufactured.

As a display element which is combined with the transparent thin film transistor 20 of the present invention, an electrophoresis reflective display unit, a transmission type liquid crystal display unit, a reflection type liquid crystal display unit, a semi-transmissive type liquid crystal display unit, an organic electroluminescence display unit, an inorganic electroluminescence display unit or the like can be used.

Figure 2:
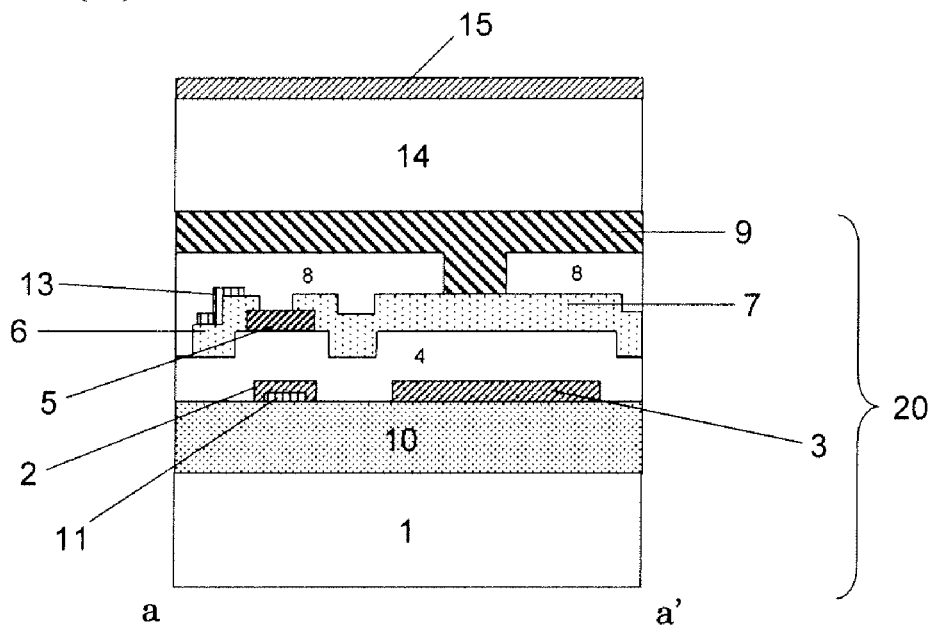
FIGS. 2(A) and (B) are partial cross-sectional diagrams which show approximately one pixel of an image display unit using a transparent thin film transistor in an example and a comparative example of the present invention. In addition, in FIGS. 2(A) and (B), ratios between film thicknesses of respective layers of a transparent thin film transistor do not show ratios between film thicknesses of a transparent thin film transistor of an actual image display unit.
FIG. 2(B) is a vertical cross-sectional view taken along the line b-b' in FIG. 3(B).
Figure 2:
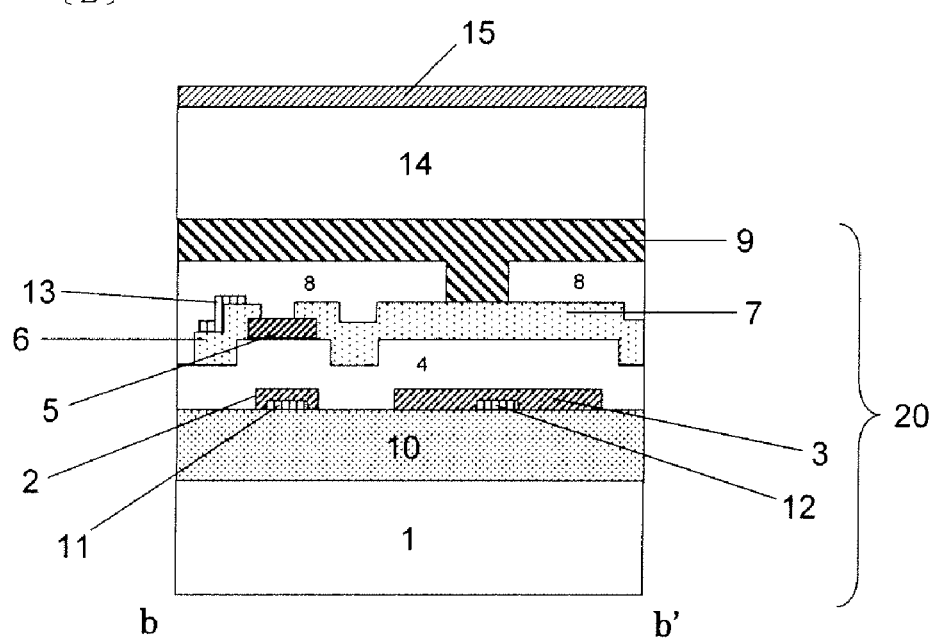
Figure 3:
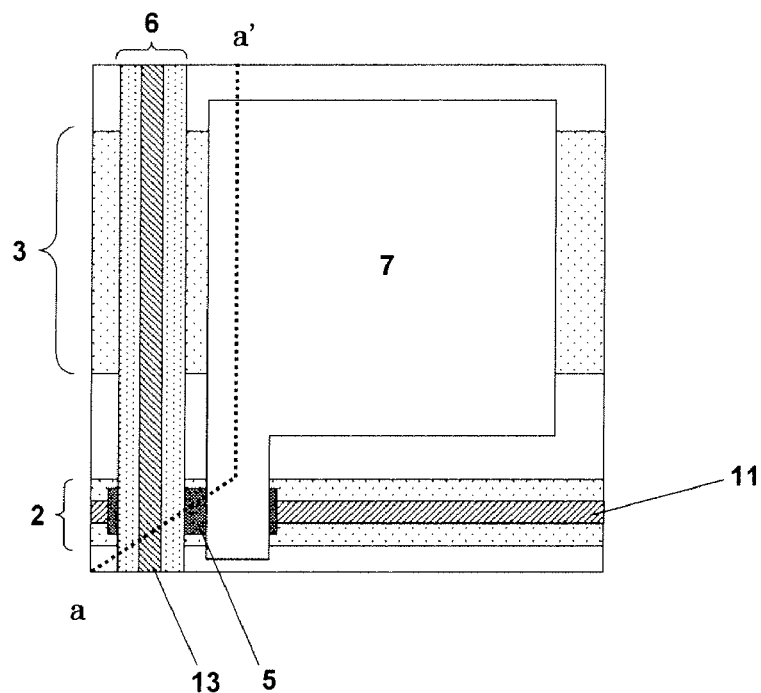
FIGS. 3(A) and (B) are plan views which show approximately one pixel of a transparent thin film transistor of an image display unit in an example and a comparative example of the present invention. In addition, a gate insulating film 4, an interlayer insulating film 8, a pixel electrode 9 and a color filter 10 are not illustrated. In addition, in FIGS. 3(A) and (B), an area ratio of a wiring and an electrode of a transparent thin film transistor to a pixel area dose not show an area ratio in a transparent thin film transistor of an actual image display unit.
Figure 3:
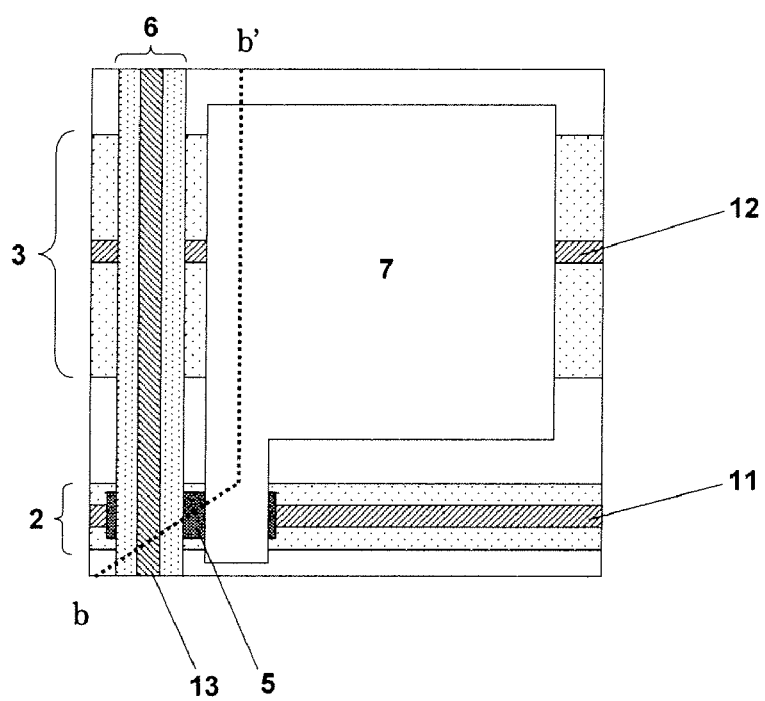

FIGS. 2(A), (B) and FIGS. 3(A), (B) show figures of Example 1 and Example 2. FIG. 2 shows a partial cross-sectional diagram which shows approximately one pixel of an image display unit in the present example. FIG. 3 shows a partial plan view which shows approximately a pixel of the transparent thin film transistor in the present examples. In addition, in these figures, thicknesses of respective layers and area ratios do not show thickness of respective layers and area ratios of a transparent thin film transistor in an actual image display unit.

In the transparent thin film transistor, a wiring resistance can be reduced and visibility is not deteriorated when two or more of wirings which are made of a thin film of a transparent conductive material and of auxiliary lines which are made of a thin film of a metal material are stacked and respective line widths of auxiliary lines are formed to be equal to or more than 1 µm and area ratios of respective auxiliary lines to display areas of the image display units are formed to be equal to or less than 10%. Therefore, a transparent thin film transistor of an image display unit can uniformly and steadily operate.

Example 1

Alkali-free glass 1737 manufactured by Corning (a thickness is 0.7 mm) was used as a substantially transparent substrate 1. The color filter 10 which has four colors, that is, red (R), green (G), blue (B) and white (transparent) (W), was formed on one side of the substantially transparent substrate 1. In particular, after respective resins were entirely applied to the glass substrate 1, R, G, B, and W in the color filter 10 were exposed by using a photomask which has an intended shape. After this, developments and baking were performed. R, G, B, and W in the color filter 10 were formed in this way. In the Example 1, at first the color filter layer R was formed. After this, G, B and W were formed in this order. As an overcoat layer (not illustrated), thermosetting transparent resin was applied to the color filter 10. The color filter 10 was formed in this way.

On the color filter 10, a film which was made of aluminum (Al) was formed so as to have a thickness of 30 nm by a DC magnetron sputtering method. In addition, by a photolithographic method, the film was patterned to have an intended shape in which a ratio of the film to a display area of an image display unit was 1%. The gate auxiliary line 11 was formed in this way.

On the gate auxiliary line 11, the gate line 2 and the capacitor line 3 were formed by making films which were made of ITO to have a thickness of 100 nm by a DC magnetron sputtering method and by patterning the films to have an intended shape by a photolithographic method.

On the gate line 2 and the capacitor line 3, the gate insulating film 4 was formed by making a film which was made of silicon oxynitride (SiON) to have a thickness of 300 nm by a RF magnetron sputtering method.

In addition, the semiconductor active layer 5 was formed by making a film which was made of indium gallium zinc oxide (In—Ga—Zn—O) to have a thickness of 40 nm by a RF magnetron sputtering method and by patterning the film to have an intended shape.

After a resist was applied to the semiconductor active layer 5, it was dried and developed. Then, the source line 6 and the drain electrode 7 were formed by making films which were made of ITO to have a thickness of 100 nm by a DC magnetron sputtering method and by performing a liftoff.

Next, after a resist was applied to the source line 6, it was dried and developed. The source auxiliary line 13 was formed by making a film which was made of Al to have a thickness of 30 nm by a DC magnetron sputtering method and by performing a liftoff.

In addition, the interlayer insulating film 8 was formed by applying an epoxide resin with a thickness of 5 μm by a printing method. Lastly, the pixel electrode 9 was formed by making a film which was made of ITO to have a thickness of 100 nm by a DC magnetron sputtering method and by patterning the film to have an intended shape.

To the formed transparent thin film transistor 20, as an electrophoresis reflective type display element which included a common electrode 15, Vizplex Imaging Film (manufactured by E Ink) was applied. The image display unit of Example 1 was formed in this way. In addition, the image display unit of the present example had a structure in which a display was seen from the color filter side through the transparent thin film transistor.

Example 2

Alkali-free glass 1737 manufactured by Corning (a thickness is 0.7 mm) was used as a substantially transparent substrate 1. The color filter 10 which was comprised of four colors, that is, red (R), green (G), blue (B) and white (transparent) (W), was formed on one side of the substantially transparent substrate 1. In particular, after respective resins were entirely applied to the glass substrate 1, the respective resins were exposed by using a photomask which has an intended shape. After this, developments and baking were performed. R, G, B, and W in the color filter 10 were formed in this way. In the present example at first the color filter layer R was formed. After this, G, B and W were formed in this order. As an overcoat layer, thermosetting transparent resin was applied to the color filter 10. The color filter 10 was formed in this way.

On the color filter 10, a film which was made of aluminum (Al) was formed so as to have a thickness of 30 nm by a DC magnetron sputtering method. In addition, by a photolithographic method, the film was patterned to be an intended shape in which a ratio of the film to a display area of an image display unit was 5%. The gate auxiliary line 11 was formed in this way.

In addition, on the gate auxiliary line 11, the gate line 2 and the capacitor line 3 were formed by making films which were made of ITO to have a thickness of 100 nm by a DC magnetron sputtering method and by patterning the films to be an intended shape by a photolithographic method.

On the gate line 2 and the capacitor line 3, the gate insulating film 4 was formed by making a film which was made of silicon oxynitride (SiON) to have a thickness of 300 nm by a RF magnetron sputtering method.

In addition, the semiconductor active layer 5 was formed by making a film which was made of indium gallium zinc oxide (In—Ga—Zn—O) to have a thickness of 40 nm by a RF magnetron sputtering method and patterning the film to have an intended shape.

After a resist was applied to the semiconductor active layer 5, it was dried and developed. In addition, the source line 6 and the drain electrode 7 were formed by making films which were made of ITO to have a thickness of 100 nm by a DC magnetron sputtering method and by performing a liftoff.

In addition, after a resist was applied to the source line 6, it was dried and developed. In addition, the source auxiliary line 13 was formed by making a film which was made of Al to have a thickness of 30 nm by a DC magnetron sputtering method and by performing a liftoff.

In addition, the interlayer insulating film 8 was formed by applying an epoxide resin with a thickness of 5 μm by a printing method. Lastly, a film which was made of ITO was formed so as to have a thickness of 100 nm by a DC magnetron sputtering method and patterned to have an intended shape. The pixel electrode 9 was formed in this way.

As an electrophoresis reflective type display element which included a common electrode 15, Vizplex Imaging Film (manufactured by E Ink) was applied to the formed transparent thin film transistor 20. The image display unit of the present example was formed in this way. In addition, the image display unit of the present example had a structure in which a display was seen from the color filter side through the transparent thin film transistor.

Example 3

Alkali-free glass 1737 manufactured by Corning (a thickness is 0.7 mm) was used as a substantially transparent substrate 1. The color filter 10 which was comprised of four colors, that is, red (R), green (G), blue (B) and white (transparent) (W), was formed on one side of the substantially transparent substrate 1. In particular, after respective resins were entirely applied to the glass substrate 1, the respective resins were exposed by using a photomask which has an intended shape. After this, developments and baking were performed. R, G, B, and W in the color filter 10 were formed in this way. In the present example at first the color filter layer R was formed. After this, G, B and W were formed in this order. As an overcoat layer, thermosetting transparent resin was applied to the color filter 10. The color filter 10 was formed in this way.

On the color filter 10, a film which was made of aluminum (Al) was formed so as to have a thickness of 30 nm by a DC magnetron sputtering method. In addition, by a photolithographic method, the film was patterned to be an intended shape in which a ratio of the film to a display area of an image display unit was 10%. The gate auxiliary line 11 was formed in this way.

In addition, on the gate auxiliary line 11, the gate line 2 and the capacitor line 3 were formed by making films which were made of ITO to have a thickness of 100 nm by a DC magnetron sputtering method and by patterning the films to have an intended shape by a photolithographic method.

On the gate line 2 and the capacitor line 3, the gate insulating film 4 was formed by making a film which was made of silicon oxynitride (SiON) to have a thickness of 300 nm by a RF magnetron sputtering method.

In addition, the semiconductor active layer 5 was formed by making a film which was made of indium gallium zinc oxide (In—Ga—Zn—O) to have a thickness of 40 nm by a RF magnetron sputtering method and patterning the film to be an intended shape.

After a resist was applied to the semiconductor active layer 5, it was dried and developed. In addition, the source line 6 and the drain electrode 7 were formed by making films which were made of ITO to have a thickness of 100 nm by a DC magnetron sputtering method and by performing a liftoff.

In addition, after a resist was applied to the source line 6, it was dried and developed. In addition, the source auxiliary line 13 was formed by making a film which was made of Al to have a thickness of 30 nm by a DC magnetron sputtering method and by performing a liftoff.

In addition, the interlayer insulating film 8 was formed by applying an epoxide resin with a thickness of 5 μm by a printing method. Lastly, a film which was made of ITO was formed so as to have a thickness of 100 nm by a DC magnetron sputtering method and patterned to have an intended shape. The pixel electrode 9 was formed in this way.

As an electrophoresis reflective type display element which included a common electrode 15, Vizplex Imaging Film (manufactured by E Ink) was applied to the formed transparent thin film transistor 20. The image display unit of the present example was formed in this way. In addition, the image display unit of the present example had a structure in which a display was seen from the color filter side through the transparent thin film transistor.

FIG. 2 and FIG. 3 show the figures of the Comparative Example 1 and the Comparative Example 2. FIG. 2 shows a partial cross-sectional diagram which shows approximately one pixel of an image display unit in the present comparative example. FIG. 3 shows a partial plan view which shows approximately one pixel of a transparent thin film transistor in the present comparative examples. In addition, in these figures, thicknesses of respective layers and area ratios do not show thickness of respective layers and area ratios of a transparent thin film transistor in an actual image display unit.

Comparative Example 1

Alkali-free glass 1737 manufactured by Corning (a thickness is 0.7 mm) was used as a substantially transparent substrate 1. The color filter 10 which was comprised of four colors, that is, red (R), green (G), blue (B) and white (transparent) (W), was formed on one side of the substantially transparent substrate 1. In particular, after respective resins were entirely applied to the glass substrate 1, the respective resins were exposed by using a photomask which has an intended shape. After this, developments and baking were performed. R, G, B, and W in the color filter 10 were formed in this way. In the present example at first the color filter layer R was formed. After this, G, B and W were formed in this order. As an overcoat layer, thermosetting transparent resin was applied to the color filter 10. The color filter 10 was formed in this way.

On the color filter 10, a film which was made of aluminum (Al) was formed so as to have a thickness of 30 nm by a DC magnetron sputtering method. In addition, by a photolithographic method, the film was patterned to be an intended shape in which a ratio of the film to a display area of an image display unit was 10%. The gate auxiliary line 11 was formed in this way.

In addition, on the gate auxiliary line 11, the gate line 2 and the capacitor line 3 were formed by making films which were made of ITO to have a thickness of 100 nm by a DC magnetron sputtering method and by patterning the films to be an intended shape by a photolithographic method.

On the gate line 2 and the capacitor line 3, the gate insulating film 4 was formed by making a film which was made of silicon oxynitride (SiON) to have a thickness of 300 nm by a RF magnetron sputtering method.

In addition, the semiconductor active layer 5 was formed by making a film which was made of indium gallium zinc oxide (In—Ga—Zn—O) to have a thickness of 40 nm by a RF magnetron sputtering method and patterning the film to be an intended shape.

After a resist was applied to the semiconductor active layer 5, it was dried and developed. In addition, the source line 6 and the drain electrode 7 were formed by making films which were made of ITO to have a thickness of 100 nm by a DC magnetron sputtering method and by performing a liftoff.

In addition, after a resist was applied to the source line 6, it was dried and developed. In addition, the source auxiliary line 13 was formed by making a film which was made of Al to have a thickness of 30 nm by a DC magnetron sputtering method and by performing a liftoff.

In addition, the interlayer insulating film 8 was formed by applying an epoxide resin with a thickness of 5 μm by a printing method. Lastly, a film which was made of ITO was formed so as to have a thickness of 100 nm by a DC magnetron sputtering method and patterned to have an intended shape. The pixel electrode 9 was formed in this way.

As an electrophoresis reflective type display element which included a common electrode 15, Vizplex Imaging Film (manufactured by E Ink) was applied to the formed transparent thin film transistor 20. The image display unit of the present example was formed in this way. In addition, the image display unit of the present example had a structure in which a display was seen from the color filter side through the transparent thin film transistor.

Comparative Example 2

Alkali-free glass 1737 manufactured by Corning (a thickness is 0.7 mm) was used as a substantially transparent substrate 1. The color filter 10 which was comprised of four colors, that is, red (R), green (G), blue (B) and white (transparent) (W), was formed on one side of the glass substrate 1. In particular, after respective resins were entirely applied to the glass substrate 1, the respective resins were exposed by using a photomask which has an intended shape. After this, developments and baking were performed. R, G, B, and W in the color filter 10 were formed in this way. In the present example at first the color filter layer R was formed. After this, G, B and W were formed in this order. As an overcoat layer, thermosetting transparent resin was applied to the color filter 10. The color filter 10 was formed in this way.

On the color filter 10, a film which was made of aluminum (Al) was formed so as to have a thickness of 30 nm by a DC magnetron sputtering method. In addition, by a photolithographic method, the film was patterned to be an intended shape in which a ratio of the film to a display area of an image display unit was 10%. The gate auxiliary line 11 was formed in this way.

In addition, on the gate auxiliary line 11, the gate line 2 and the capacitor line 3 were formed by making films which were made of ITO to have a thickness of 100 nm by a DC magnetron sputtering method and by patterning the films to be an intended shape by a photolithographic method.

On the gate line 2 and the capacitor line 3, the gate insulating film 4 was formed by making a film which was made of silicon oxynitride (SiON) to have a thickness of 300 nm by a RF magnetron sputtering method.

In addition, the semiconductor active layer 5 was formed by making a film which was made of indium gallium zinc oxide (In—Ga—Zn—O) to have a thickness of 40 nm by a RF magnetron sputtering method and patterning the film to be an intended shape.

After a resist was applied to the semiconductor active layer 5, it was dried and developed. In addition, the source line 6 and the drain electrode 7 were formed by making films which were made of ITO to have a thickness of 100 nm by a DC magnetron sputtering method and by performing a liftoff.

In addition, after a resist was applied to the source line 6, it was dried and developed. In addition, the source auxiliary line 13 was formed by making a film which was made of Al to have a thickness of 30 nm by a DC magnetron sputtering method and by performing a liftoff.

In addition, the interlayer insulating film 8 was formed by applying an epoxide resin with a thickness of 5 μm by a printing method. Lastly, a film which was made of ITO was formed so as to have a thickness of 100 nm by a DC magnetron sputtering method and patterned to have an intended shape. The pixel electrode 9 was formed in this way.

As an electrophoresis reflective type display element which included a common electrode 15, Vizplex Imaging Film (manufactured by E Ink) was applied to the formed transparent thin film transistor 20. The image display unit of the present example was formed in this way. In addition, the image display unit of the present example had a structure in which a display was seen from the color filter side through the transparent thin film transistor.

Figure 4:
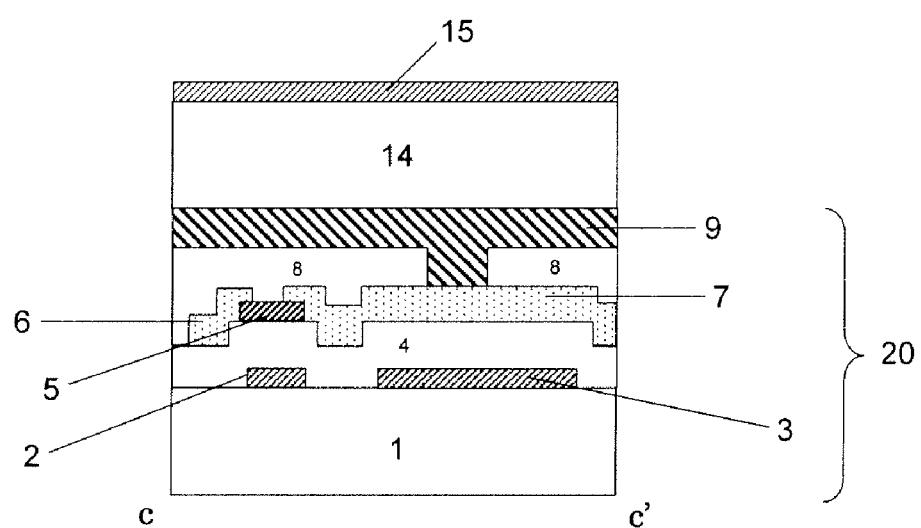
FIG. 4 is a partial cross-sectional diagram which shows approximately one pixel of an image display unit using a transparent thin film transistor in a comparative example of the present invention. In addition, in FIGS. 4(A) and (B), ratios between film thicknesses of respective layers of a transparent thin film transistor do not show ratios between film thicknesses of a transparent thin film transistor of an actual image display unit.
Figure 5:
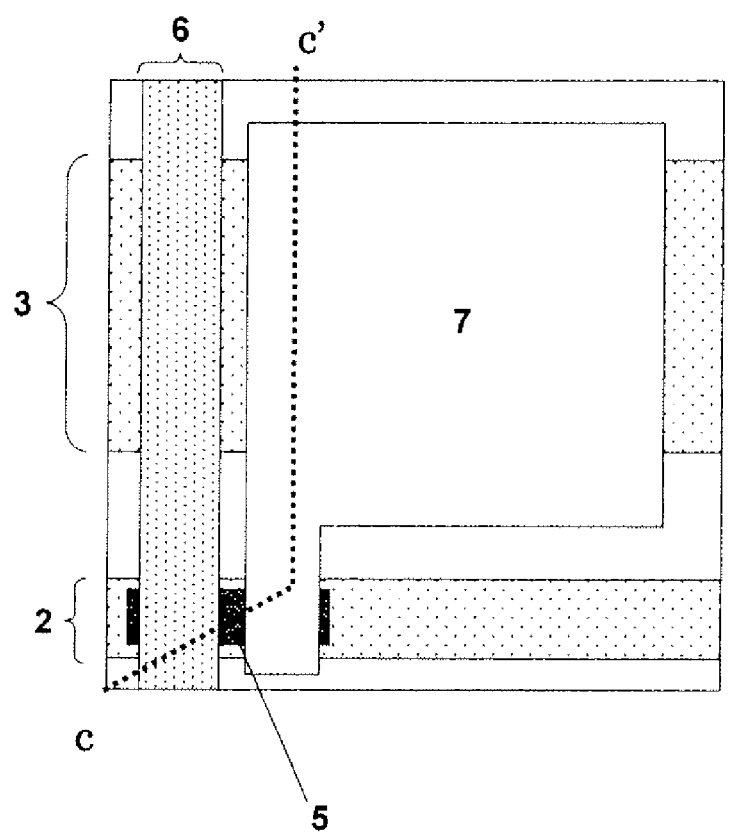
FIG. 5 is a partial plan view which shows approximately one pixel of a transparent thin film transistor of an image display unit in a comparative example of the present invention. In addition, a gate insulating film 4, an interlayer insulating film 8, a pixel electrode 9 and a color filter 10 are not illustrated. In addition, in FIG. 5, an area ratio of a wiring and an electrode of a transparent thin film transistor to a pixel area dose not show an area ratio in a transparent thin film transistor of an actual image display unit.

Comparative Example 3 is shown in FIG. 4 and FIG. 5. FIG. 4 is a partial cross-sectional diagram which shows approximately one pixel of an image display unit in the comparative examples. FIG. 5 is a partial plan view which shows approximately one pixel of a transparent thin film transistor in the comparative examples. In addition, in these figures, thicknesses of respective layers and area ratios do not show thickness of respective layers and area ratios of a transparent thin film transistor in an actual image display unit.

Comparative Example 3

Alkali-free glass 1737 manufactured by Corning (a thickness is 0.7 mm) was used as a substantially transparent substrate 1. The color filter 10 which was comprised of four colors, that is, red (R), green (G), blue (B) and white (transparent) (W), was formed on one side of the glass substrate 1. In particular, after respective resins were entirely applied to the glass substrate 1, the respective resins were exposed by using a photomask which has an intended shape. After this, developments and baking were performed. R, G, B, and W in the color filter 10 were formed in this way. In the present example at first the color filter layer R was formed. After this, G, B and W were formed in this order. As an overcoat layer, thermosetting transparent resin was applied to the color filter 10. The color filter 10 was formed in this way.

In addition, on the color filter 10, the gate line 2 and the capacitor line 3 were formed by making films which were made of ITO to have a thickness of 100 nm by a DC magnetron sputtering method and by patterning the films to have an intended shape by a photolithographic method.

On the gate line 2 and the capacitor line 3, the gate insulating film 4 was formed by making a film which was made of silicon oxynitride (SiON) to have a thickness of 300 nm by a RF magnetron sputtering method.

In addition, the semiconductor active layer 5 was formed by making a film which was made of indium gallium zinc oxide (In—Ga—Zn—O) to have a thickness of 40 nm by a RF magnetron sputtering method and patterning the film to be an intended shape.

After a resist was applied to the semiconductor active layer 5, it was dried and developed. In addition, the source line 6 and the drain electrode 7 were formed by making films which were made of ITO to have a thickness of 100 nm by a DC magnetron sputtering method and by performing a liftoff.

In addition, the interlayer insulating film 8 was formed by applying an epoxide resin with a thickness of 5 μm by a printing method. Lastly, a film which was made of ITO was formed so as to have a thickness of 100 nm by a DC magnetron sputtering method and patterned to have an intended shape. The pixel electrode 9 was formed in this way.

As an electrophoresis reflective type display element which included a common electrode 15, Vizplex Imaging Film (manufactured by E Ink) was applied to the formed transparent thin film transistor 20. The image display unit of the present example was formed in this way. In addition, the image display unit of the present example had a structure in which a display was seen from the color filter side through the transparent thin film transistor.

In addition, resistance values of both ends of one line of the gate lines in display areas of the image display units formed in Examples 1-3 and Comparative Examples 1-3 were measured and compared. Measured resistance values were 127 kΩ in Example 1, 58 kΩ in Example 2, 29 kΩ in Example 3, 610 kΩ in Comparative Example 1 and 20 kΩ in Comparative Example 2, when two layers, that is, the gate lines 2 which were made of a thin film of a transparent conductive material and the gate auxiliary lines 11 which were made of a thin film of a metal material (an auxiliary line) were stacked in the Examples 1-3 and Comparative Examples 1 and 2.

On the other hand, a resistance value of the gate line 2 which was made of a transparent thin conductive material of Comparative Example 3 was 808 kΩ.

According to the above resistance values of the gate lines 2, it was found that a wiring resistance could be reduced, if a wiring which was made of a thin film of a transparent conductive material and an auxiliary line which was made of a thin film of a metal material were stacked. However, in Comparative Example 1, even if an auxiliary line was formed, the line width was so narrow that patterning could not be performed well and disconnection of the line was partially observed. Therefore, in Comparative Example 1, the effect of forming an auxiliary line could not be obtained. Table 2 shows respective wiring resistances values of examples and comparative examples.

TABLE 2

| An area ratio of an auxiliary line to a display area | Visual quality | Line width | Wiring resistance |
|---|---|---|---|
| 0% (Comparative Example 3) | Display defect of an edge space | — | 808 kΩ |
| 0.5% (Comparative Example 1) | Display defect of an edge space | 0.5 μm | 610 kΩ |
| 1% (Example 1) | acceptable | 1 μm | 127 kΩ |
| 5% (Example 2) | excellent | 5 μm | 58 kΩ |
| 10% (Example 3) | acceptable | 10 μm | 29 kΩ |
| 15% (Comparative Example 2) | Visual deterioration by an auxiliary line | 15 μm | 20 kΩ |

When visual qualities of the image display units formed in the examples and comparative examples were compared respectively, image displays which were almost uniform were obtained in the image display units of Examples 1, 2, and 3. In particular, in Example 2, an image display of high quality was obtained. On the other hand, in the image display units of Comparative Examples 1 and 3, because values of wiring resistances were high, delays of the signals were occurred. Therefore, the phenomenon which the image display was unclear in an edge space of the image display unit could be observed. In Comparative Example 2, an area ratio of the gate auxiliary line 11 which was made of a thin film of Aluminum to a display area of the image display unit was higher than the area ratios in Examples 1 and 2. Therefore, transparency of the transparent thin film transistor was reduced and an aperture ratio of the display area of the image display unit was reduced. Thereafter, visual quality of the image display unit was caused to deteriorate. Table 2 shows respective visual qualities of examples and comparative examples.

According to the results of examples and comparative examples, in the transparent thin film transistor, a wiring resistance could be reduced and visibility was not deteriorated when two or more of the gate lines 2 and the source lines 6 which were made of a thin film of a transparent conductive material and of the gate auxiliary lines 11 and the source auxiliary lines 13 which were made of a thin film of a metal material were stacked and respective line widths of auxiliary lines were formed to be equal to or more than 1 μm and area ratios of respective auxiliary lines to display areas of the image display units were formed to be equal to or less than 10%. Therefore, the transparent thin film transistor of the image display unit steadily and uniformly operated.

What is claimed is:

1. A transparent thin film transistor comprising:
    a substantially transparent substrate;
    a gate line in which a thin film of a substantially transparent conductive material and a thin film of a metal material are stacked,
    a substantially transparent gate insulating layer;
    a substantially transparent semiconductor active layer; and
    a source line in which a thin film of a substantially transparent conductive material and a thin film of a metal material are stacked, and
    a drain electrode including a thin film of a substantially transparent conductive material, said source line and said drain electrode being formed apart from each other and sandwiching said substantially transparent semiconductor active layer,
    wherein said thin film of said metal material of said source line is stacked on said substantially transparent conductive material of said source line, and said thin film of said substantially transparent conductive material of said gate line is stacked on said thin film of said metal material of said gate line, and
    wherein a line width of said thin film of said metal material of said gate line and of said thin film of said metal material of said source line is narrower than a line width of said thin film of said substantially transparent conductive material of said gate line and of said thin film of said substantially transparent conductive material of said source line.

2. The transparent thin film transistor according to claim 1, wherein a film thickness of any one or more of said thin film of said metal material of said gate line and of said thin film of said metal material of said source line is equal to or more than 5 nm and equal to or less than 150 nm.

3. The transparent thin film transistor according to claim 1, wherein said substantially transparent semiconductor active layer has a metal oxide as a main component.

4. The transparent thin film transistor according to claim 1, wherein a part where said source line and said substantially transparent semiconductor active layer meet is made of a substantially transparent oxide conductive material.

5. The transparent thin film transistor according to claim 1, further comprising a capacitor line including a thin film of a substantially transparent conductive material.

6. The transparent thin film transistor according to claim 1, further comprising a capacitor line in which a thin film of a substantially transparent conductive material and a thin film of a metal material are stacked,
    wherein a line width of said thin film of said metal material of said capacitor line is narrower than a line width of said thin film of said substantially transparent conductive material of said capacitor line, and
    wherein said thin film of said substantially transparent conductive material of said capacitor line is stacked on said thin film of said metal material of said capacitor line.

7. An image display unit comprising:
    the transparent thin film transistor according to claim 1;
    a substantially transparent interlayer insulating film and,
    a substantially transparent pixel electrode which is electrically connected with said drain electrode, said substantially pixel electrode being formed on said interlayer insulating film.

8. The image display unit according to claim 7, wherein a film thickness of any one or more of said thin film of said metal material of said gate line and of said thin film of said metal material of said source line is equal to or more than 5 nm and equal to or less than 150 nm.

9. The image display unit according to claim 7, further comprising a capacitor line in which a thin film of a substantially transparent conductive material and a thin film of a metal material are stacked,
    wherein a line width of said thin film of said metal material of said capacitor line is narrower than a line width of said thin film of said substantially transparent conductive material of said capacitor line, and
    wherein said thin film of said substantially transparent conductive material of said capacitor line is stacked on said thin film of said metal material of said capacitor line.

10. The image display unit according to claim 7, wherein said line width of said thin film of said metal material of said source line and of said thin film of said metal material of said gate line is equal to or more than 1 μm, and wherein
    each area ratio of said line width to a display area of said image display unit is equal to or less than 10%.

11. The image display unit according to claim 7, wherein said substantially transparent semiconductor active layer has metal oxide as a main component.

12. The image display unit according to claim 7, wherein a part where said source line and said substantially transparent semiconductor active layer meet is made of a substantially transparent oxide conductive material.

13. The image display unit according to claim 7, wherein a color filter is formed between said substantially transparent substrate and a layer in which said gate line is formed.

14. The image display unit according to claim 7, wherein said image display unit is any one of an electrophoresis reflective display unit, a transmission type liquid crystal display unit, a reflection type liquid crystal display unit, a semi-transmissive type liquid crystal display unit, an organic electroluminescence display unit or an inorganic electroluminescence display unit.

15. A transparent thin film transistor comprising:
    a substantially transparent substrate;

a gate line in which a thin film of a substantially transparent conductive material and a thin film of a metal material are stacked, a substantially transparent gate insulating layer;

a substantially transparent semiconductor active layer; and a source line in which a thin film of a substantially transparent conductive material and a thin film of a metal material are stacked, and a drain electrode including a thin film of a substantially transparent conductive material, said source line and said drain electrode being formed apart from each other and sandwiching said substantially transparent semiconductor active layer, wherein said thin film of said metal material of said source line is stacked on said substantially transparent conductive material of said source line, and said thin film of said substantially transparent conductive material of said gate line is stacked on said thin film of said metal material of said gate line, and wherein a line width of said thin film of said metal material of said gate line and of said thin film of said metal material of said source line is narrower than a line width of said thin film of said substantially transparent conductive material of said gate line and of said thin film of said substantially transparent conductive material of said source line, and a film thickness of any one or more of said thin film of said metal material of said gate line and of said thin film of said metal material of said source line is equal to or more than 5 nm and equal to or less than 150 nm.

16. An image display unit comprising the transparent thin film transistor according to claim 15, wherein said line width of said thin film of said metal material of said source line and of said thin film of said metal material of said gate line is equal to or more than 1 μm, and wherein each area ratio of said line width to a display area of said image display unit is equal to or less than 10%.

* * * * *